US012603411B2

(12) United States Patent
Liu et al.

(10) Patent No.: US 12,603,411 B2
(45) Date of Patent: Apr. 14, 2026

(54) READING DEVICE FOR SUPERCONDUCTING QUBIT

(71) Applicant: University Of Science And Technology Of China, Hefei (CN)

(72) Inventors: Fengming Liu, Hefei (CN); Mingcheng Chen, Hefei (CN); Can Wang, Hefei (CN); Chaoyang Lu, Hefei (CN); Jianwei Pan, Hefei (CN)

(73) Assignee: University Of Science And Technology Of China, Hefei (CN)

( * ) Notice: Subject to any disclaimer, the term of this patent is extended or adjusted under 35 U.S.C. 154(b) by 165 days.

(21) Appl. No.: 18/291,195

(22) PCT Filed: Jul. 23, 2021

(86) PCT No.: PCT/CN2021/108175
§ 371 (c)(1),
(2) Date: Jan. 22, 2024

(87) PCT Pub. No.: WO2023/000309
PCT Pub. Date: Jan. 26, 2023

(65) Prior Publication Data
US 2024/0332779 A1 Oct. 3, 2024

(51) Int. Cl.
*H01P 7/06* (2006.01)
*G06N 10/40* (2022.01)
*H01P 5/08* (2006.01)
*H10N 60/12* (2023.01)

(52) U.S. Cl.
CPC .............. *H01P 7/06* (2013.01); *G06N 10/40* (2022.01); *H01P 5/08* (2013.01); *H10N 60/12* (2023.02)

(58) Field of Classification Search
CPC .. H01P 5/08; H01P 7/06; H10N 60/12; G06N 10/40; G06N 10/00
See application file for complete search history.

(56) References Cited

U.S. PATENT DOCUMENTS

| | | | | |
|---|---|---|---|---|
| 10,217,057 | B2* | 2/2019 | Barends | F41J 1/10 |
| 10,628,753 | B2* | 4/2020 | Kelly | H03K 3/38 |
| 11,790,259 | B2* | 10/2023 | Harris | G06F 15/7867 257/31 |
| 2003/0173997 | A1* | 9/2003 | Blais | B82Y 10/00 257/E39.015 |

(Continued)

FOREIGN PATENT DOCUMENTS

| | | |
|---|---|---|
| CN | 109784492 A | 5/2019 |
| CN | 110738320 A | 1/2020 |

(Continued)

OTHER PUBLICATIONS

"Chinese Application Serial No. 202110847640.6, Office Action dated Jun. 30, 2023", w/English Translation, (Jun. 30, 2023), 7 pgs.

(Continued)

*Primary Examiner* — Quan Tra
(74) *Attorney, Agent, or Firm* — Schwegman Lundberg & Woessner, P.A.

(57) ABSTRACT

The present disclosure provides a reading device for superconducting qubit, including a qubit, a reading cavity and a Josephson junction, where the qubit is coupled with the reading cavity through the Josephson junction.

8 Claims, 3 Drawing Sheets

(56) References Cited

U.S. PATENT DOCUMENTS

| | | | |
|---|---|---|---|
| 2003/0207766 A1 | 11/2003 | Esteve et al. | |
| 2006/0097746 A1 | 5/2006 | Amin | |
| 2009/0078931 A1 | 3/2009 | Berkley | |
| 2009/0078932 A1* | 3/2009 | Amin | G06N 10/40 |
| | | | 257/31 |
| 2019/0214971 A1* | 7/2019 | Keane | H03H 11/04 |
| 2022/0092462 A1* | 3/2022 | Huai | G06N 10/00 |

FOREIGN PATENT DOCUMENTS

| | | |
|---|---|---|
| CN | 111723936 A | 9/2020 |
| CN | 111967603 A | 11/2020 |

OTHER PUBLICATIONS

"International Application Serial No. PCT/CN2021/108175, International Search Report dated Apr. 8, 2022", w/ English Translation, (Apr. 8, 2022), 2 pgs.

"International Application Serial No. PCT/CN2021/108175, Written Opinion dated Apr. 8, 2022", (Apr. 8, 2022), 3 pgs.

Blais, Alexandre, et al., "Cavity quantum electrodynamics for superconducting electrical circuits: An architecture for quantum computation", Physical Review A 69.6, (2004), 14 pgs.

Jeffrey, Evan, et al., "Fast accurate state measurement with superconducting qubits", Physical review letters 112.19, (2014), 190504.

Jin, Yirong, "Superconductivity meets quantum computation", Chinese Journal of Nature vol. 42 No. 4, (Aug. 24, 2020), 10 pgs.

Mao, Guang Feng, et al., "Superconducting Quantum Bits Based on Josephson Devices", Progress in Physics vol. 26 No. 1, (Apr. 30, 2007), 9 pgs.

* cited by examiner

READING DEVICE FOR SUPERCONDUCTING QUBIT

PRIORITY APPLICATIONS

This application is a U.S. National Stage Filing under 35 U.S.C. § 371 from International Application No. PCT/CN2021/108175, filed on Jul. 23, 2021, and published as WO2023/000309 on Jan. 26, 2023; the benefit of priority of which is hereby claimed herein, and which application and publication are hereby incorporated herein by reference in their entirety.

TECHNICAL FIELD

The present disclosure relates to a field of quantum computing, and in particular, to a reading device for superconducting qubit.

BACKGROUND

Dispersion measurement of superconducting qubits refers to coupling the qubit to be measured with a linear resonant cavity, so that a frequency of the resonant cavity will be changed by a state of the qubit. In this way, it is possible to indirectly measure the state of the qubit by measuring the frequency of the resonant cavity.

The key to dispersion measurement is to couple the qubit with a reading cavity. In related art, generally the superconducting qubit is coupled with a resonant cavity through a capacitance. The effect generated by such coupling structure is a transverse coupling in quantum mechanics, also referred to as XX coupling. Hamiltonian of such coupling structure may be written as follow:

$$H = \omega_r a^\dagger a - \frac{\omega_q}{2}\sigma_z + g(\sigma_+ a + \sigma_- a^\dagger),$$

where $\omega_r$ is a frequency of the reading cavity, $\omega_q$ is a transition frequency of the qubit, and g is a coupling strength between the qubit and the reading cavity. When a detuning $\Delta = \omega_q - \omega_r$ between the qubit and the reading cavity is sufficiently large (g $\ll \Delta$ compared to a strength of a coupler, a reference frame transformation may be performed on the above Hamiltonian by $$U = \exp\left[-\frac{g}{\Delta}(\sigma_+ a - \sigma_- a^\dagger)\right],$$

so as to obtain a representation of the above Hamiltonian on an energy eigenstate of a qubit-reading cavity system:

$$H = \omega_r a^\dagger a + \frac{\omega_q}{2}\sigma_z - \frac{g^2}{\Delta}\sigma_z a^\dagger a.$$

As seen from the above Hamiltonian, under an energy eigenstate basis vector of the system, the coupling between the qubit and the reading cavity is changed to a longitudinal coupling (ZZ coupling), and the frequency of the reading cavity will be changed by the state of the qubit. Such phenomenon is also referred to as AC Stark effect.

In a process of implementing the concept of the present disclosure, the inventors have found at least following problems in the relevant art: the coupling between the qubit and the reading cavity as described above is substantially a transverse coupling, and it behaves as a longitudinal coupling only under the energy eigenstate basis vector of the qubit-reading cavity in the premise of large detuning approximation. Therefore, when reading signals are strong and a number of photons in the reading cavity is large, the qubit will be driven by the reading cavity, thereby causing measurement errors. Therefore, the intensity of the reading signals in related art is limited. Considering the existence of noise in the reading signals, the limit of the intensity of the reading signals will be directly transformed into a limit of a reading fidelity.

SUMMARY

The present disclosure provides a reading device for superconducting qubit, including: a qubit, a reading cavity and a Josephson junction, where the qubit is coupled with the reading cavity through the Josephson junction.

In an example, the qubit of the reading device and the reading cavity are coupled by ZZ coupling of the Josephson junction under respective independent energy eigenstate basis vectors.

In an example, the reading cavity is a distributed transmission-line-type resonant cavity.

In an example, the qubit and the transmission-line-type resonant cavity are coupled by one Josephson junction. A position of a connection point of the Josephson junction and the transmission-line-type resonant cavity and a characteristic impedance of a transmission line are determined according to a parameter such as a required coupling strength.

In an example, the qubit and the transmission-line-type resonant cavity are connected by two or more Josephson junctions.

In an example, the qubit is coupled with the reading cavity by both the Josephson junction and a capacitor.

In an example, the qubit is a Transmon qubit or a Plasonium qubit.

In an example, the reading cavity is coupled to a reading line. The reading cavity is coupled with the reading line by capacitive coupling or inductive coupling.

In an example, an independent magnetic flux control line is included for controlling a magnetic flux in a loop where the Josephson junction for coupling is located.

In an example, a target value that the magnetic flux is controlled to reach is an integer number of magnetic flux quanta, where the magnetic flux is a magnetic flux in a loop where the Josephson junction for coupling is located.

DETAILED DESCRIPTION OF EMBODIMENTS

The present disclosure realizes true longitudinal coupling (ZZ coupling) of a qubit-reading cavity system, i.e. the Hamiltonian formed by encoding respective independent energy eigenstates of the qubit and reading cavity behaves as a ZZ coupling. The reading device with such coupling structure may greatly increase the intensity of reading signals, so as to increase a signal-to-noise ratio of the reading signals and improve a reading fidelity.

The present disclosure mainly changes the coupling structure of the qubit and reading cavity system. Unlike the previous method of coupling the qubit and the reading cavity through the capacitance, a Josephson junction is used to couple the qubit with the reading cavity, that is, the qubit is coupled together with the reading cavity through the Josephson junction in the present disclosure.

In order to make the purpose, technical solution, and advantages of the present disclosure clearer, the present disclosure is further explained in detail in conjunction with specific embodiments and with reference to the accompanying drawings.

The reading cavity in the present disclosure may employ a transmission-line-type resonant cavity structure. The transmission-line-type resonant cavity is the reading cavity which is currently the most widely used and easy to be manufactured, so that the transmission-line-type reading cavity will be mainly explained in the embodiments.

Figure 1:
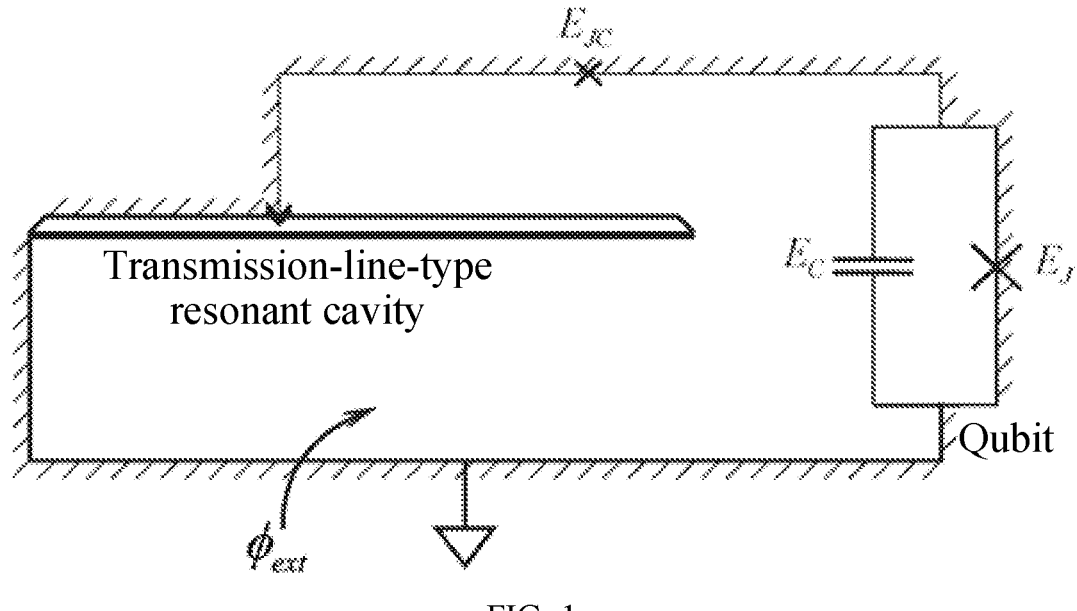
FIG. 1 is a schematic diagram of a coupling structure of a qubit and a reading cavity provided in an embodiment of the present disclosure.

FIG. 1 schematically shows a coupling structure of a qubit and a reading cavity in the present disclosure. The qubit is connected to a point on a transmission-line-type resonant cavity through a Josephson junction. The line indicated by shaded lines in FIG. 1 forms a loop, through which an applied magnetic flux $\phi_{ext}$ passes.

The following is a derivation of the Hamiltonian of this system to illustrate the specific coupling form of the qubit and the reading cavity in this system.

Firstly, the reading cavity and the qubit are quantized as an independent system. The state on the transmission line may be represented by a phase of each point on the transmission line. Due to charge conservation, the phase on the transmission line meets a sine function distribution. Taking a transmission-line-type resonant cavity of a quarter wavelength as an example, its phase distribution is $\phi=\phi_r \sin(\pi x/2l)$, where x is a distance between the point and a short-circuited end of the resonant cavity, l is a total length of the resonant cavity, and $\phi_r$ is a maximum value of the phase on the resonant cavity. Therefore, the state of the resonant cavity may be described by the phase $\phi_r$ and its conjugate variable (denoted as a Cooper pair operator $n_r$). A relationship between a phase operator, the Cooper pair operator and generation annihilation operators ($\hat{a}$, $\hat{a}^\dagger$) of the resonant cavity may be written as follow:

$$\hat{\phi}_r = A(\hat{a} + \hat{a}^\dagger)$$

$$\hat{n}_r = -\frac{i}{2A}(\hat{a} - \hat{a}^\dagger),$$

where A is a parameter related to a property of the resonant cavity, and its value is related to a length of the cavity, a characteristic impedance of a transmission line, etc.

Regarding the state of the qubit, a Transmon qubit which is currently the most commonly used in superconducting quantum computing will be taken as an example for discussion. It may be represented by a phase operator (denoted as $\hat{\varphi}$), a Cooper pair operator (denoted as $\hat{n}$) and generation annihilation operators ($\hat{b}$, $\hat{b}^\dagger$) of the qubit. A relationship between the phase operator, the Cooper pair operator and the generation annihilation operators is as follow:

$$\hat{\varphi} = \left(\frac{8E_C}{E_J}\right)^{1/4}(\hat{b} + \hat{b}^\dagger)\bigg/\sqrt{2}$$

$$\hat{n} = -i\left(\frac{E_J}{8E_C}\right)^{1/4}(\hat{b} - \hat{b}^\dagger)\bigg/\sqrt{2},$$

where $E_J$ is a Josephson energy of the Transmon qubit, and $E_C$ is a charge energy of the Transmon qubit.

Figure 2:
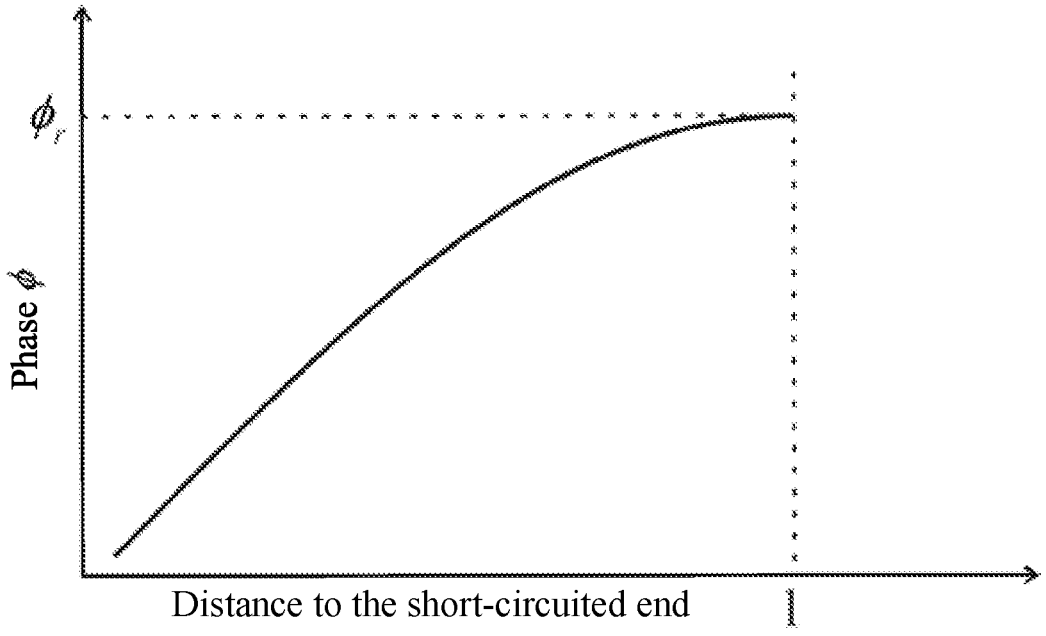
FIG. 2 is a phase distribution diagram of a transmission line provided in an embodiment of the present disclosure.

As shown in FIG. 2, the phase of any point on the transmission line may be obtained by calculating the sine function distribution of the phase of each point on the transmission line. Taking a transmission line of a quarter wavelength as an example, if a distance between the connection point of the transmission line and a coupling Josephson junction and a short-circuited end of the transmission line is x, its phase is $$\hat{\phi} = A(\hat{a} + \hat{a}^\dagger)\sin(\pi x/2l) \equiv kA(\hat{a} + \hat{a}^\dagger).$$

For ease of description, a distribution weight $\sin(\pi x/2l)$ of the phase is replaced by a coefficient k, as shown in the above equation.

The Hamiltonian of the system coupling with the Josephson junction, that is, a coupling term of the qubit and the reading cavity is $$H_I =$$

$$-E_{JC}\cos(\hat{\phi} - \hat{\varphi} + \phi_{ext}) = -E_{JC}\cos(\hat{\phi} - \hat{\varphi})\cos(\phi_{ext}) + E_{JC}\sin(\hat{\phi} - \hat{\varphi})\sin(\phi_{ext}).$$

where $E_{JC}$ is a Josephson energy of the coupling Josephson junction, and $\phi_{ext}$ is an applied magnetic flux passing through a loop (as shown by shaded lines in FIG. 1) where the coupling Josephson junction and a qubit Josephson junction are located in the system. When the applied magnetic flux is an integer number of magnetic flux quanta, the coupling term is $$H_I = -E_{JC}(\cos\hat{\phi}\cos\hat{\varphi} + \sin\hat{\phi}\sin\hat{\varphi}).$$

The trigonometric function in the above equation is performed a Taylor expansion to a second-order term, that is $$\cos\psi \sim 1 - \frac{1}{2}\psi^2$$

$$\sin\psi \sim \psi.$$

The coupling term may be written in the form of respective generation annihilation operators of the qubit and the reading cavity, as follow:

$$H_I \sim E_{JC} k^2 A^2 \left(\frac{2E_C}{E_J}\right)^{1/2} \hat{a}\hat{a}^\dagger \hat{b}\hat{b}^\dagger +$$

$$E_{JC} k A \left(\frac{2E_C}{E_J}\right)^{1/4} \left(\hat{a}\hat{b}^\dagger + \hat{a}^\dagger \hat{b}\right) + \frac{1}{2} E_{JC} k^2 A^2 \left(\frac{E_C}{2E_j}\right)^{1/2} \hat{a}^2 \hat{a}^{\dagger 2} \hat{b}^2 \hat{b}^{\dagger 2}. \quad 5$$

The above equation has omitted terms, such as constant terms, which are unrelated to coupling. The first term in the above equation represents a longitudinal coupling, the second term represents a transverse coupling, and the third term represents two-photon transverse coupling. Therefore, the coupling structure in the present disclosure may achieve the longitudinal coupling as achieved by a capacitive coupling structure in the related art, and the transverse coupling. The strength of various forms of coupling is related to parameters, such as the energy of the coupling Josephson junction, a connection position of the coupling Josephson junction and the transmission-line-type resonant cavity, and the characteristic impedance of the transmission line. Therefore, the above parameters may be determined according to requirements such as coupling strength.

In order to further explain the feasibility of the present disclosure, a specific design parameter will be taken as an example for explanation.

It is assumed that the transmission-line-type resonant cavity is the transmission-line-type resonant cavity with quarter wavelength, then $$A = \sqrt{\frac{16e^2 Z_0}{h}},$$

where $Z_0$ is a characteristic impedance of the transmission line, e is an amount of electronic charge, and h is a Planck constant. The coupling Josephson energy is taken as $E_{JC}$=200 MHZ, the charge energy of the qubit is $E_C$=0.24 GHZ the Josephson energy is $E_J$=15 GHZ, the frequency of the transmission-line-type resonant cavity is 6.4 GHz, the characteristic impedance is 50Ω, and the coupling Josephson junction and the resonant cavity are connected at an open-circuited end of the resonant cavity. According to the above parameters, the transition frequency of the qubit is about 5.1 GHZ, k=1, and A=0.176. At this point, the ZZ coupling strength between the qubit and the reading cavity may be 0.78 MHZ, the XX coupling strength is 12.5 MHZ, and the two-photon XX coupling strength is 0.20 MHz. In other words, the frequency of the reading cavity has been changed by 0.78 MHZ, when the qubit is in a based state or a first excited state. If the pure transverse coupling method in the related art is adopted, a transverse coupling strength of about 52 MHz is required in a case that the qubit and the frequency of the reading cavity remains unchanged, which is three times greater than the transverse coupling of 12.5 MHZ in the present disclosure. Therefore, the present disclosure may greatly increase the power of reading signals. In addition, the influence of two-photon XX coupling and other high-order terms omitted in the Taylor expansion due to the extremely small coupling strength may be ignored.

The above discussion is conducted in a case that the applied magnetic flux in the circuit is equal to an integer number of magnetic flux quanta. When the applied magnetic flux is not equal to an integer number of magnetic flux quanta, calculation may be performed in the same manner as discussed above. There will be terms such as an XZ coupling in the coupling Hamiltonian, while the XX coupling and the ZZ coupling will be decreased proportionally: In fact, the new coupling terms such as the XZ coupling may be ignored due to a mismatch of frequency. However, the reduced ZZ coupling strength will affect the effect of reading. Therefore, it is required to control the applied magnetic flux to be close to an integer number of magnetic flux quanta (usually (in practice) in practical applications. If it is required, an independent magnetic flux control line may be used to adjust the magnitude of the magnetic flux.

The above discussion is about a reading device that uses a Josephson junction to couple the reading cavity with the qubit. In fact, it is also possible to use a plurality of Josephson junctions to couple the reading cavity with the qubit. The following is a scheme of dual Josephson junction coupling. The scheme may use the symmetry of two Josephson junctions to further offset the XX coupling term, thereby improving the reading fidelity.

Figure 3:
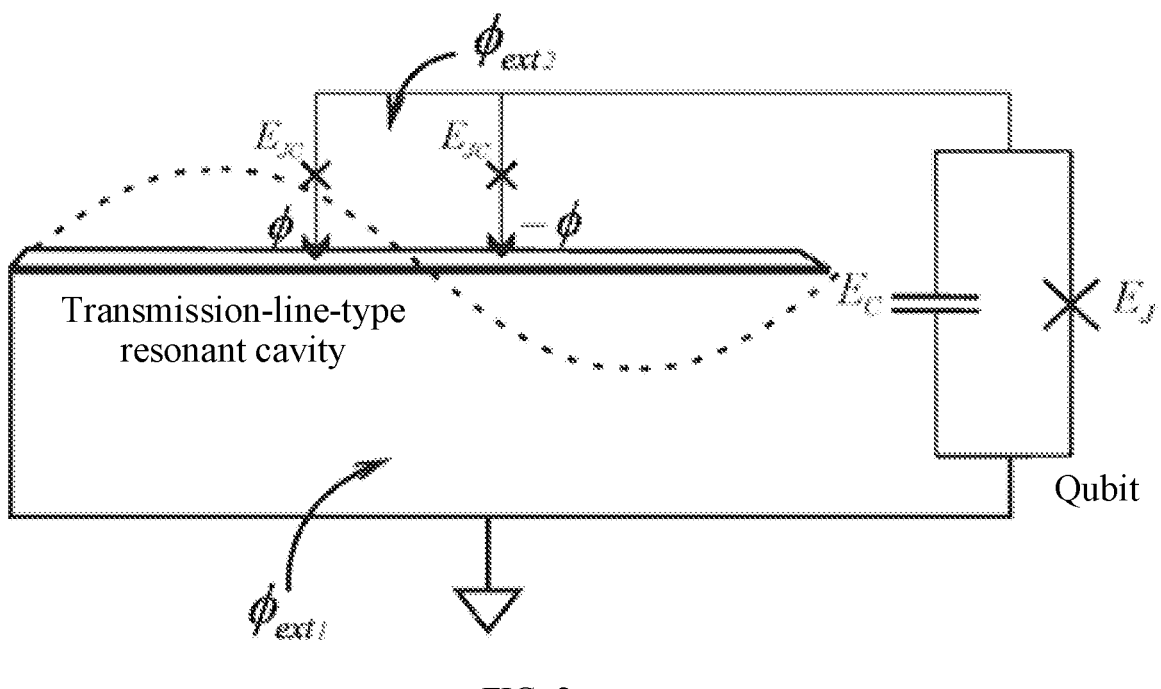
FIG. 3 is a schematic structural diagram of a reading cavity and a qubit coupled by dual Josephson junctions provided in an embodiment of the present disclosure.

As shown in FIG. 3, two Josephson junctions and the transmission-line-type resonant cavity are connected at positions symmetrical with respect to the phase 0, and phases at coupling points of the resonant cavity are $\phi$ and $-\phi$, respectively. The phase operator of the qubit is $\hat{\varphi}$. The system has two loops, and the applied magnetic flux in these two loops are represented as $\phi_{ext1}$ and $\phi_{ext2}$ in the diagram. When the two applied magnetic fluxes are integer number of magnetic flux quantum, the coupling Hamiltonian of the system is $$H_I = -E_{JC}\left[\cos\left(-\hat{\phi} - \hat{\varphi}\right) + \cos\left(\hat{\phi} - \hat{\varphi}\right)\right] = -2E_{JC}\cos\hat{\phi}\cos\hat{\varphi}.$$

Referring to the discussion of the calculation method for single Josephson junction coupling, it may be found that there is no XX coupling term in the coupling Hamiltonian, but the ZZ coupling term still exists. Therefore, such structure may further solve driving errors caused by residual XX coupling during reading the qubit, which helps to further improve the reading fidelity.

Figure 4:
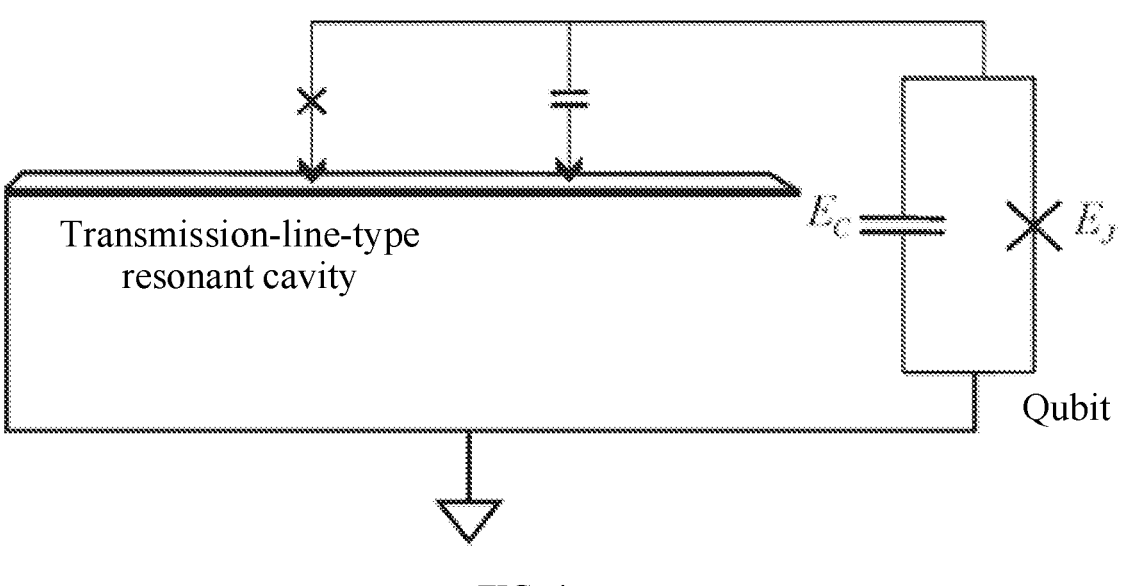
FIG. 4 is a schematic structural diagram of a reading cavity and a qubit coupled by both a Josephson junction and a capacitor provided in an embodiment of the present disclosure.

The coupling of the reading cavity and the qubit in the present disclosure may be achieved through the Josephson junction, or through capacitive coupling in combination with the Josephson junction. FIG. 4 schematically shows a reading device that includes a Josephson junction coupling and a capacitance coupling. The Josephson junction coupling may generate the aforementioned XX coupling and ZZ coupling, while the capacitive coupling may generate the XX coupling as described in the background technology: By adjusting the size of the coupling Josephson junction, the size of coupling capacitance, the position of the connection point of the reading cavity and the coupling Josephson junction and the position of the connection point of the reading cavity and the coupling capacitance, the XX coupling strength may be at least partially offset.

The reading device mainly includes a qubit, a reading cavity, and a coupling Josephson junction. The qubit may be the Transmon qubit which is the most commonly used, or other forms of qubit such as the Plasonium qubit (patent publication number CN111723936A). The reading cavity may be a distributed transmission-line-type resonant cavity or an LC resonator under a lumped parameter model. If a distributed transmission-line-type resonant cavity is used, it may be divided into a quarter wavelength cavity, a half wavelength cavity, a three-quarters wavelength cavity, etc. according to the length of the cavity: The quarter wavelength cavity has the best practicality since it occupies small space and has good integration.

Embodiments of the present disclosure are mainly aimed at the case that the reading cavity is a transmission-line-type resonant cavity, but the content may be easily extended to include other cases such as LC resonators under a lumped model of the reading cavity. For example, the LC resonator under the lumped model may be represented by phase operators and Cooper pair operators to represent its state, and calculate the coupling of the LC resonator and the qubit. The specific process will not be repeated here.

Figure 5:
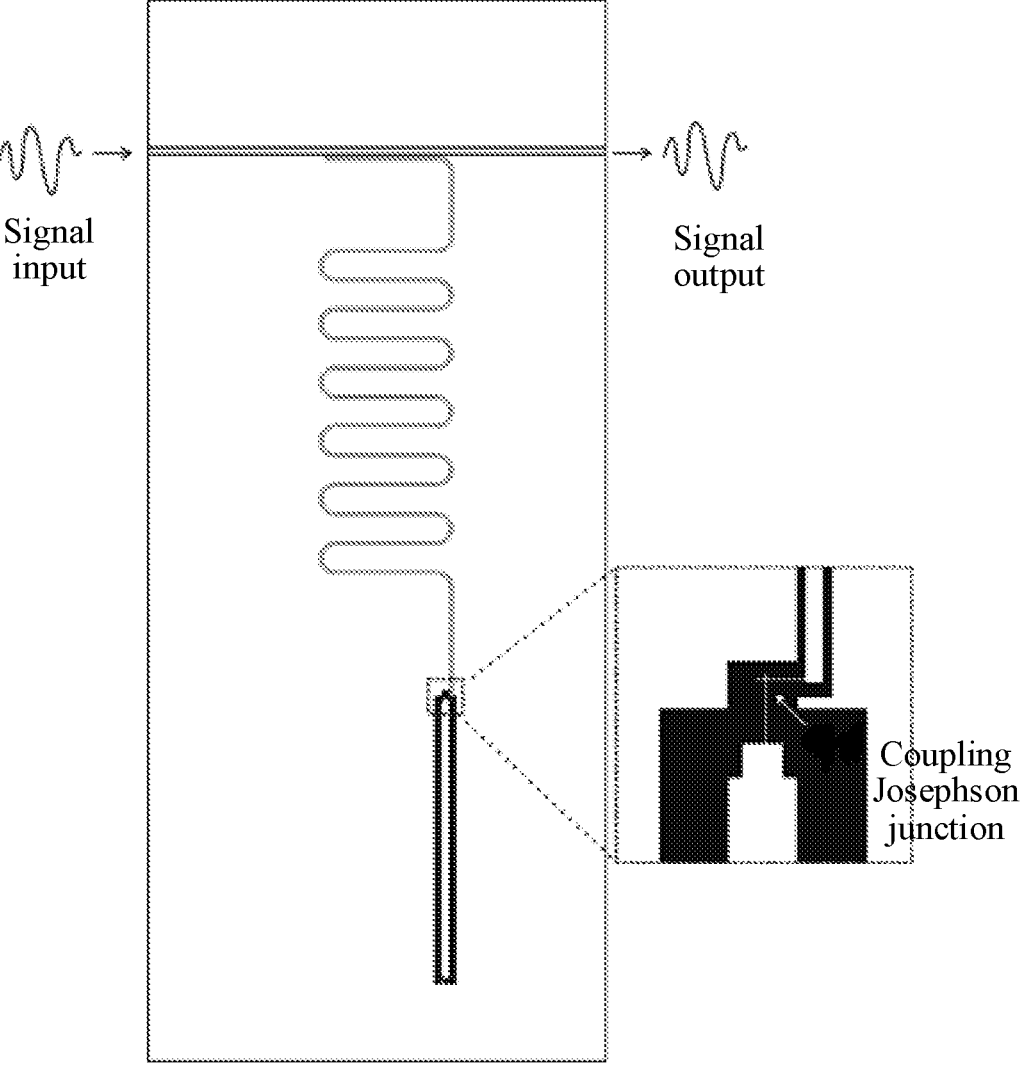
FIG. 5 is a design diagram of a reading device provided in an embodiment of the present disclosure.

As shown in FIG. 5, a partial design diagram of a reading device is shown in a solid box. The white part in the figure represents a superconductor, and the black part represents a substrate of an unattached superconductor. A qubit is coupled with a resonant cavity through a Josephson junction, and a coupling part is magnified and displayed in a dashed box. The resonant cavity in the figure is formed by a transmission line with a length of one quarter wavelength. One end of the transmission line is short-circuited, and the other end of the transmission line is open-circuited. A coupling Josephson junction and the reading cavity are connected to the open-circuited end of the transmission line. The resonant cavity is coupled to a reading line. The coupling of the resonant cavity with the reading line may be capacitive coupling or inductive coupling, and the coupling method shown in the figure is capacitive coupling. A reading signal is input from one end of the reading line and output from the other end of the reading line. The state of the qubit may be determined by measuring the output reading signal.

The reading device and reading method proposed in the present disclosure are both within the framework of dispersion measurement, and may be combined with any other dispersion measurement methods. For example, reading signals may be input from one end and output from the other end. It is also possible to input and output from the same end. A filter structure may be introduced on the reading line, so as to reduce a loss of signals of the reading cavity and a relaxation phenomenon of the qubit caused by the Purcell effect.

In summary, compared with traditional reading devices, the reading device for superconducting qubit of the present disclosure has at least the following beneficial effects compared to the related art.

The present disclosure achieves the longitudinal coupling (ZZ coupling) of the qubit and the reading cavity, reduces the driving errors of the qubit during reading caused by the transverse coupling (XX coupling) in the related art, so that the reading fidelity may be improved by increasing the reading power in applications.

The specific embodiments described above provide further detailed explanations of the purpose, technical solution, and beneficial effects of the present disclosure. It should be understood that the above are only specific embodiments of the present disclosure and are not intended to limit the present disclosure. Any modifications, equivalent substitutions, improvements, etc. made within the spirit and principles of the present disclosure should be included within the scope of protection of the present disclosure.

What is claimed is:

1. A reading device for superconducting qubit, applied to dispersion measurement for the superconducting qubit, the reading device comprising: a qubit, a reading cavity and a Josephson junction, wherein the qubit is coupled with the reading cavity through the Josephson junction, wherein the qubit of the reading device and the reading cavity are coupled by ZZ coupling of the Josephson junction under respective independent energy eigenstate basis vectors, the reading cavity is a distributed transmission-line-type resonant cavity, a frequency of the transmission-line-type resonant cavity is changed by a state of the qubit, and a position of a connection point of the Josephson junction and the transmission-line-type resonant cavity and a characteristic impedance of a transmission line are determined according to a required coupling strength.

2. The reading device of claim 1, wherein the qubit and the transmission-line-type resonant cavity are coupled by one Josephson junction.

3. The reading device of claim 1, wherein the qubit and the transmission-line-type resonant cavity are connected by two or more Josephson junctions.

4. The reading device of claim 1, wherein the qubit is coupled with the reading cavity by both the Josephson junction and a capacitor.

5. The reading device of claim 1, wherein the qubit is a Transmon qubit or a Plasonium qubit.

6. The reading device of claim 1, wherein the reading cavity is coupled to a reading line, and the reading cavity is coupled with the reading line by capacitive coupling or inductive coupling.

7. The reading device of claim 1, further comprising an independent magnetic flux control line for controlling a magnetic flux in a loop where the Josephson junction for coupling is located.

8. The reading device of claim 1, wherein a target value that a magnetic flux is controlled to reach is an integer number of magnetic flux quanta, wherein the magnetic flux is a magnetic flux in a loop where the Josephson junction for coupling is located.

* * * * *